United States Patent [19]

Argyroudis

[11] Patent Number: 6,023,717
[45] Date of Patent: Feb. 8, 2000

[54] METHOD AND APPARATUS FOR POLYPHASE DIGITAL FILTERING IN A MOBILE TELEPHONE

[75] Inventor: Panayotis Argyroudis, San Diego, Calif.

[73] Assignee: Qualcomm Incorporated, San Diego, Calif.

[21] Appl. No.: 08/741,231

[22] Filed: Oct. 30, 1996

[51] Int. Cl.[7] .................................................. G06F 17/10
[52] U.S. Cl. ............................ 708/300; 708/301; 708/319
[58] Field of Search ...................... 364/724.011, 724.012, 364/724.013, 724.014, 724.05, 724.16, 724.17, 724.18, 724.19, 724.2; 708/300, 301, 302, 303, 308, 313, 319, 320, 321, 322, 323

[56] References Cited

U.S. PATENT DOCUMENTS

| | | | |
|---|---|---|---|
| 4,817,025 | 3/1989 | Asai et al. ........................ | 364/724.012 |
| 5,648,922 | 7/1997 | Han ................................. | 364/724.011 |
| 5,668,895 | 9/1997 | Yamazaki et al. ................ | 364/724.011 |

OTHER PUBLICATIONS

"Design and Implementation of Efficient Resampling Filters Using Polyphase Recursive All–Pass Filters–" fred harris, et al. 1991 IEEE, pp. 1031–1036.

"On the Design and Performance of Efficient and Novel Filter Structures Using Recursive Allpass Filters" fred harris. Keynote Presentation International Symposium on Signal Processing and its Applications Gold Coast, Australia, Aug. 16–21, 1992.

Digital T/2 Nyquist Filtering Using Recursive All–Pass Two–Stage Resampling Filters for a Wide Range of Selectable Signaling Rates fred harris, et al. 1992 IEEE, pp. 676–680.

*Primary Examiner*—Emmanuel L. Moise
*Attorney, Agent, or Firm*—Russell B. Miller; Brian S. Edmonston; Raymond B. Hom

[57] ABSTRACT

A discrete polyphase digital filter is provided having only a single multiplier and a single cumulative adder for use in a mobile telephone. In one implementation, the filter is a discrete N-phase digital filter including an input line providing an input signal and a group of M delay elements connected to the input line for generating M successively delayed versions of the input signal. A coefficient memory unit is provided for storing M filter coefficients. A multiplier is connected to outputs of the delay elements and to the coefficient memory for multiplying the output of each successive delay element with a corresponding coefficient. A cumulative adder is also provided for summing M successive outputs from the multiplier to provide a single, filtered output signal for each group of M input signals. The multiplier and adder are operated at a rate of M/N times a frequency of the input signal to thereby provide one output signal for every N input signals. By implementing the filter with a single multiplier and a single cumulative adder, a separate multiplier and adder need not provided along with each delay element of each row of the filter. Hence, a considerable savings in circuit area is achieved while also gaining the power savings of a polyphase filter. A specific implementation wherein N is 3 and M is 14 is described.

7 Claims, 6 Drawing Sheets

METHOD AND APPARATUS FOR POLYPHASE DIGITAL FILTERING IN A MOBILE TELEPHONE

BACKGROUND OF THE INVENTION

I. Field of the Invention

The invention generally relates to digital filters and in particular to digital filters for use in mobile telephones.

II. Description of the Related Art

Figure 1:
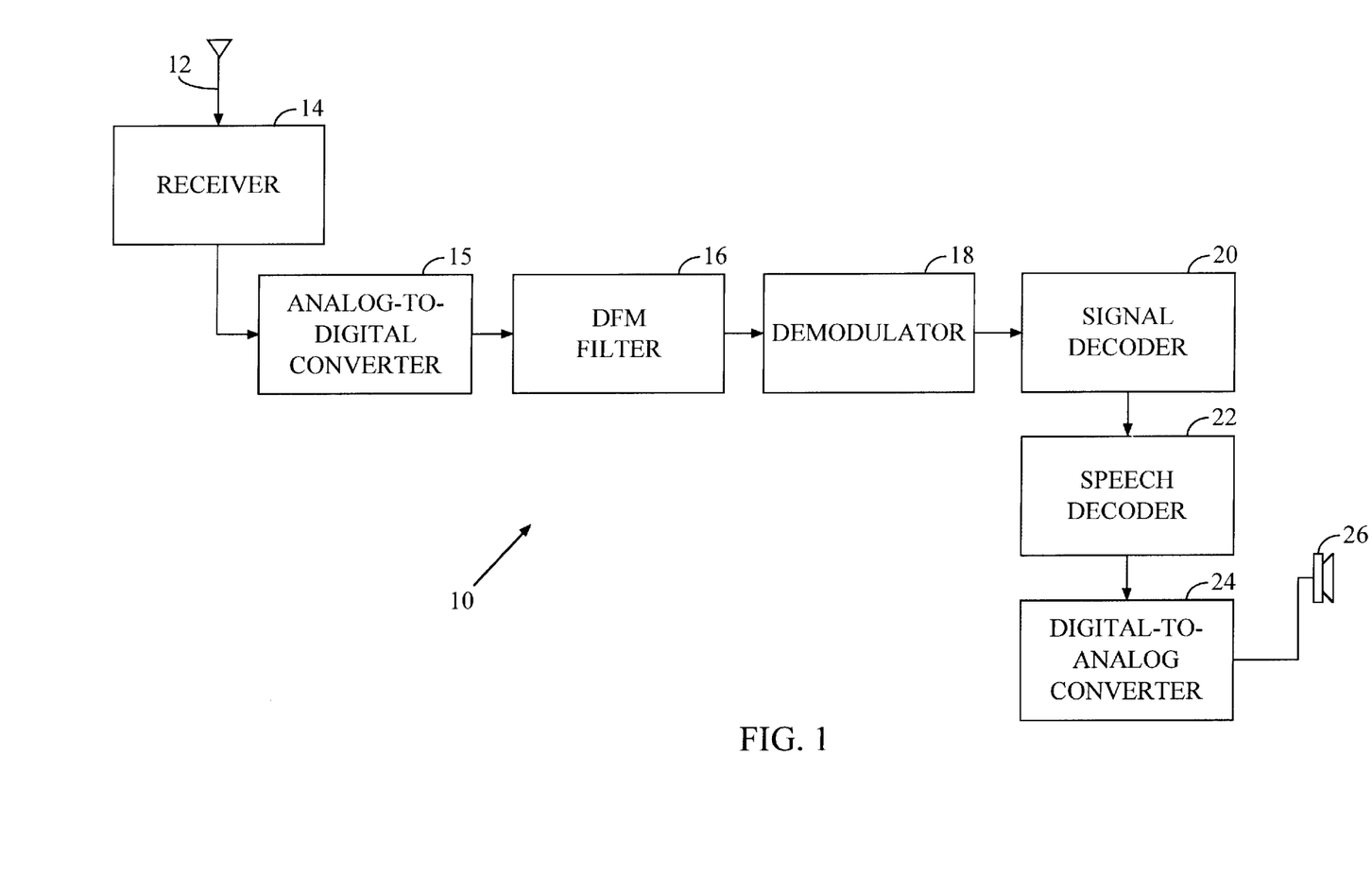
FIG. 1 is a block diagram illustrating a receive portion of a mobile telephone employing a digital lowpass digital filter.

Some digital mobile telephones, such as CDMA telephones, employ digital filters for performing low bandpass filtering to eliminate noise and other interference from a received signal. FIG. 1 illustrates pertinent receive components of an exemplary mobile telephone 10.

A signal carrying, for example, encoded speech is received by antenna 12, downconverted to a baseband and amplified, if necessary, by receiver 14 then routed through an analog-to-digital converter (ADC) 15 for conversion to discrete samples. The discrete samples are routed through a digital filter 16 to be described in greater detail below which filters out frequencies below a selected threshold. The threshold is selected to distinguish between information components of the transmitted signal and noise and other interference components. The signals are then demodulated by a demodulator 18 and decoded by a signal decoder 20. Output signals from the signal decoder are routed to a speech decoder 22 for conversion to digitized voice signals. The digitized voice signals are converted to analog signals by a digital to analog converter (DAC) 24 for ultimate output through a speaker 26 of the mobile telephone. Other components, such as error detection and correction components, may be provided as well within the receive portion of the mobile telephone.

Figure 2:
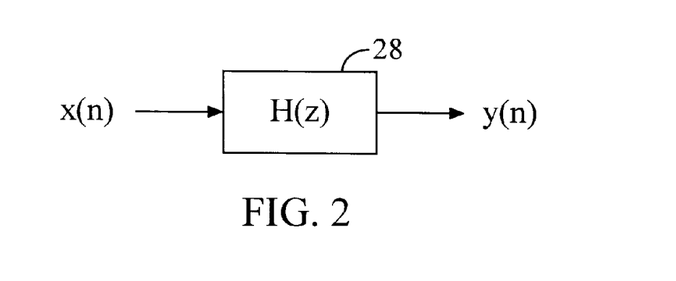
FIG. 2 is a symbolic representation of a digital filter as represented by a transfer function H(z)

As noted, the digital filter is employed for low-pass filtering of the received digitized samples. The operation of a generic digital filter is represented by the transform equation of FIG. 2 wherein a discrete input signal $x(n)$ is filtered by a transfer function $H(z)$ 28 into a discrete output signal $y(n)$. The output signal and transfer function may be represented mathematically by:

$$y(n) = \sum_{k=-\infty}^{k=+\infty} h_i x(n-1), \; i = -m \to m \qquad \text{Eq. (1)}$$

$$H(z) = \sum_{k=-\infty}^{k=+\infty} h_n z^{-n} \qquad \text{Eq. (2)}$$

Figure 3:
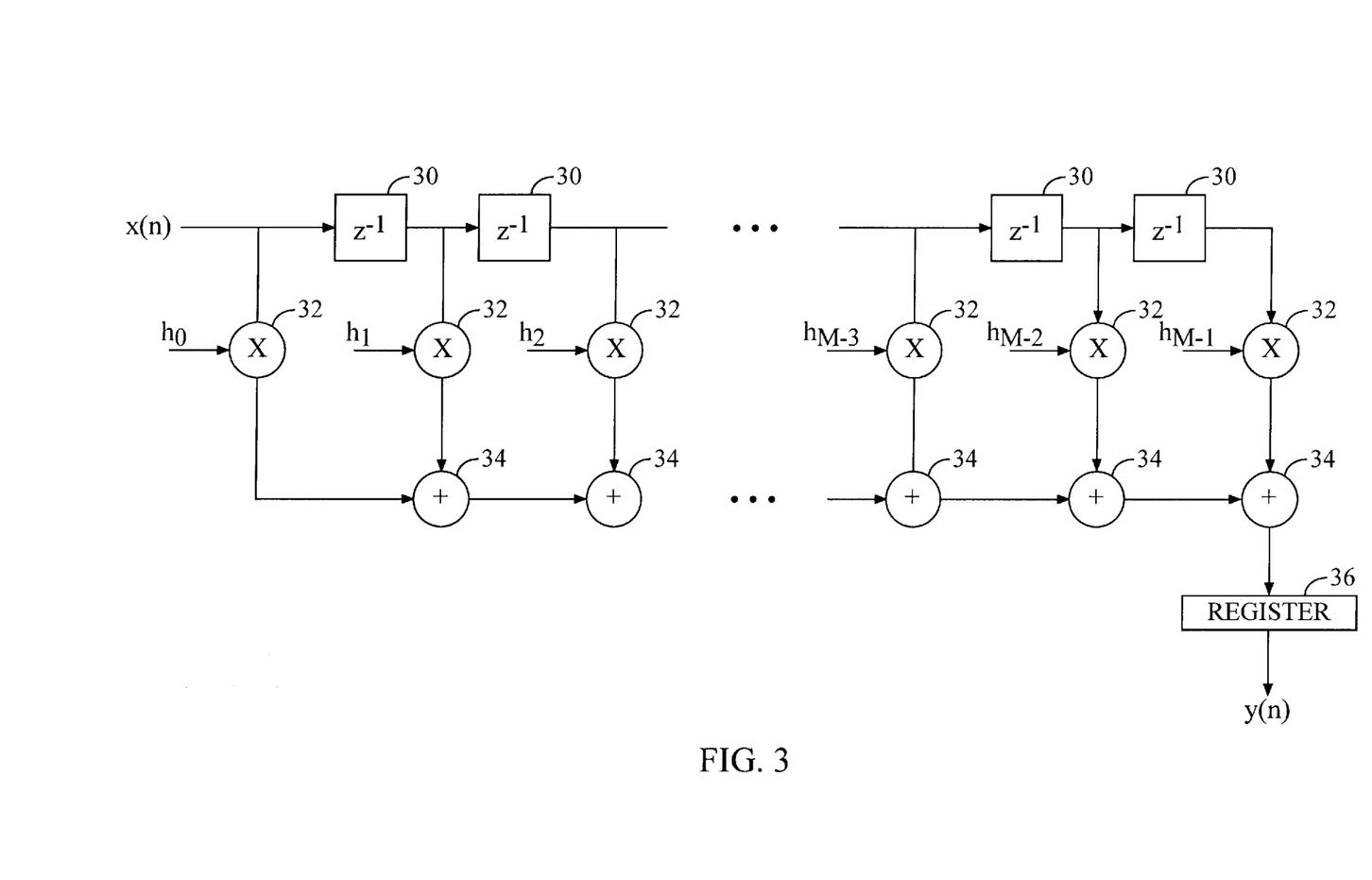
FIG. 3 is a schematic representation of an exemplary implementation of the digital filter of FIG. 2.

A finite implementation of the generic filter is set forth in FIG. 3 for a filter employing M filter coefficients A group of M $z^{-1}$ delay elements 30 generate successively delayed versions of an $x(n)$ input signal. The input signal and each delayed version are routed through multipliers 32 for multiplication against respective filter coefficients $h_0$–$h_{M-1}$. The results are summed by a set of adders 34, held in a register 36, then output as $y(n)$. As can be seen, the filter of FIG. 3 performs the summation of Equation (1) for k=0 to M–1.

For the exemplary implementation of the mobile telephone of FIG. 1, digitized signals are received by the digital filter at about 120 thousand samples per second (ks/sec). If the digital filter were implemented as set forth in FIG. 3, considerable energy would be expended by the adders and multipliers. For mobile telephones, which typically employ a rechargeable battery power source, it is critical that the amount of power consumed by the telephone be minimized to ensure sufficient operating time before recharging is necessary. One technique for reducing the amount of power consumed by the adders and multipliers of the digital filter is to implement it as a polyphase decimating filter wherein the adders and multipliers operate at only a fraction of the rate of the input signals. In the most popular of semiconductor technologies CMOS, the relationship between power and frequency is linear. So reducing the rate of operation (clock frequency) of a circuit directly reduces power consumption.

In this regard, the aforementioned transfer function may be rewritten as follows:

$$H(z) = E_0(z) + z^{-1}E_1(z) + z^{-2}E_2(z) \qquad \text{Eq.(3)}$$

where $$E_0(z) = \sum_{n=-\infty}^{n=+\infty} h(3n) z^{-3n} \qquad \text{Eq. (4)}$$

$$= h_0 + h_3 z^{-3} + h_6 z^{-6} + h_9 z^{-9} + h_{12} z^{-12} + \ldots$$

$$E_1(z) = \sum_{n=-\infty}^{n=+\infty} h(3n+1) z^{-3n}$$

$$= h_1 + h_4 z^{-3} + h_7 z^{-6} + h_{10} z^{-9} + h_{13} z^{-12} + \ldots$$

$$E_2(z) = \sum_{n=-\infty}^{n=+\infty} h(3n+2) z^{-3n}$$

$$= h_2 + h_5 z^{-3} + h_8 z^{-6} + h_{11} z^{-9} + h_{14} z^{-12} + \ldots$$

For a finite implementation employing fourteen filter coefficients, $E_0(z)$, $E_1(z)$ and $E_2(z)$ are approximated as:

$$E_0(z) \approx h_0 + h_3 z^{-3} + h_6 z^{-6} + h_9 z^{-9} + h_{12} z^{-12}$$

$$E_1(z) \approx h_1 + h_4 z^{-3} + h_7 z^{-6} + h_{10} z^{-9} + h_{13} z^{-12}$$

$$E_2(z) \approx h_2 + h_5 z^{-3} + h_8 z^{-6} + h_{11} z^{-9} \qquad \text{Eq.(5)}$$

Figure 4:
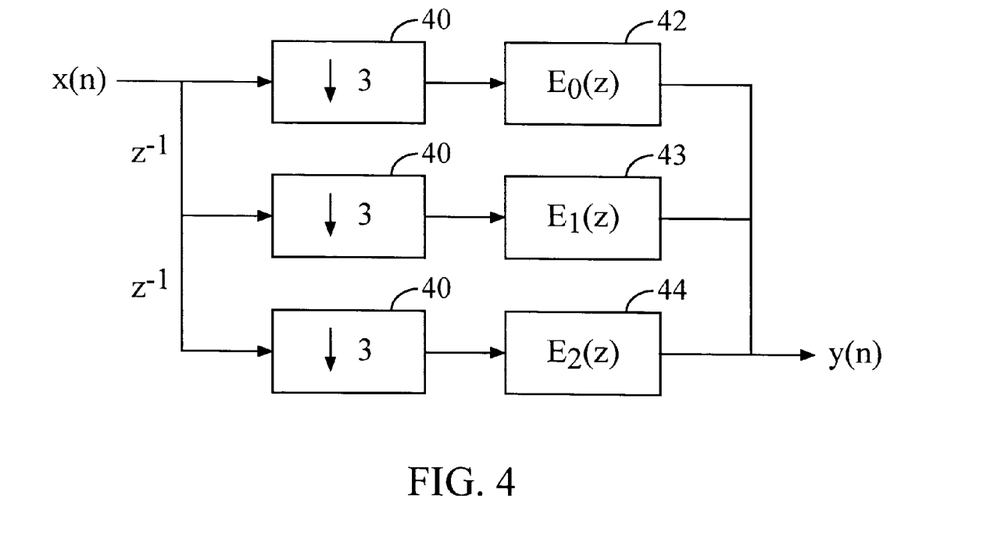
FIG. 4 symbolically illustrates a three phase decimating filter represented by transfer functions $E_0(z)$, $E_1(z)$ and $E_2(z)$.

Hence, the transfer function $H(z)$ may be decomposed into three separate $E(z)$ transfer functions to provide a three-phase decimating filter. FIG. 4 symbolically illustrates the resulting three-phase filter which employs three decimating units 40 along with three $E(z)$ transfer function units 42, 43, and 44 corresponding to $E_0(z)$, $E_1(z)$ and $E_2(z)$ respectively. The filter provides an output signal $y(n)$ at a rate that is one third of the rate of an input signal $x(n)$. With this decimating filter implementation, power is saved within the filter because:

a) Lower frequency of operation results directly in lower power dissipation for CMOS technology, b) lower frequency adder and multiplier components may be employed.

Therefore their implementations may contain fewer logic gates, translating to smaller parasitic capacitances and therefore reduction on their power dissipation. Moreover, other components of the mobile telephone that receive the filtered signal, such as the decoder and demodulator described above, may operate at lower frequencies as well thereby saving further power.

Figure 5:
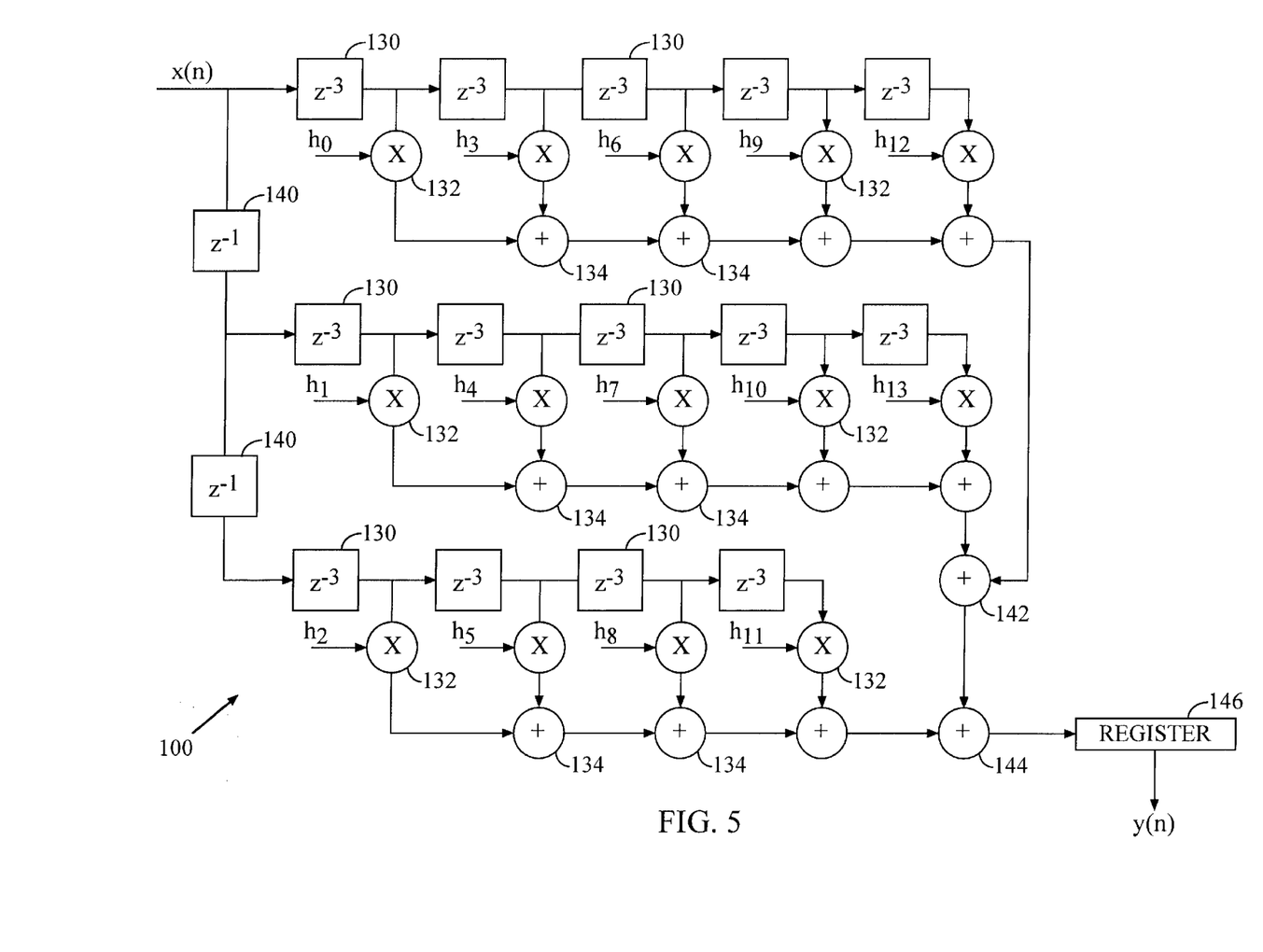
FIG. 5 is a schematic representation of an exemplary implementation of the three phase digital filter of FIG. 4.

FIG. 5 illustrates one possible implementation of a three phase filter 100. Three groups or stages of sub-filters are provided with each group having $Z^{-3}$ delay elements 130, multipliers 132, and adders 134. Delay elements 130 may be implemented as latches enabled by a clock signal (not shown) operating at one third of the rate of the input signal $x(n)$. For example, delay elements 130 may be operated at 40 kHz for an input signal having 120 ks/sec. Hence, multipliers 132 and adders 134 likewise operate at 40 kHz rather than 120 kHz thereby consuming less power. To offset the signals input to the three stages of the filter, additional $Z^{-1}$ delay elements 140 are provided, each enabled by a clock signal operating at the rate of the input signal. As a result, for an input stream comprising samples $x_1$, $x_2$, $x_3$, $x_4$, $x_5$, $x_6$, etc., the first row of multipliers and adders processes $x_3$, $x_6$, $x_9$, etc., the second row of multipliers and adders processes $x_2$, $x_5$, $x_8$, etc., and the third row of multipliers and adders processes $x_1$, $x_4$, $x_7$, etc. Coefficients for applying to the multipliers are distributed as shown such that the filters perform the mathematical operations of Equation (5) above, to thereby evaluate $E_0(z)$, $E_1(z)$ and $E_2(z)$. (In this regard, initially, $h_0$ is multiplied by $x_3$, $h_1$ by $x_2$ and $h_2$ by $x_1$. Then, $h_0$ is multiplied by $x_6$, $h_1$ by $x_5$ and $h_2$ by $x_4$ while $h_3$ is multiplied by $x_3$, $h_4$ by $x_2$ and $h_5$ by $x_1$ etc.) Additional adders 142 and 144 add the outputs of the three rows together for latching in a final register 146 which is enabled by the one-third rate clock signal to thereby output y(n) at a rate one third that of x(n). Hence, one output signal y(n) is generated during every three cycles of the input signal x(n).

Hence, the three-phase polyphase filter of FIG. 5 uses less power than a single phase implementation and is therefore desirable for use in a mobile telephone or similar device operating from a limited power supply. However, room for improvement remains. As described, a separate multiplier and adder is required in connection with each delay element of each row of the filter. The many multipliers and adders each require numerous logic gates and are thereby expensive both in terms of circuit space and in terms of design, manufacturing and reliability costs. Circuit space and cost are both important factors in mobile telephones and similar devices which are preferably as small and as inexpensive as possible.

Accordingly it would be desirable to provide a polyphase digital filter which has the power saving advantages of a polyphase filter but which requires fewer multipliers and adders and is thereby smaller and more cost effective. It is to that end that aspects of the present invention are primarily directed.

SUMMARY OF THE INVENTION

In accordance with the invention, a polyphase digital filter architecture is provided having only a single multiplier and a single cumulative adder. The final goal being to make this function integrable together with other functions in a single cost effective and low power monolithic CMOS Integrated Circuit (I.C).

In one implementation, the filter is a discrete N-phase digital filter including an input line providing an input signal and a group of M delay elements connected to the input line for generating M successively delayed versions of the input signal. A coefficient memory unit is provided for storing M filter coefficients. A multiplier is connected to outputs of the delay elements, in a shared bus fashion, and to the coefficient memory for multiplying the output of each successive delay element with a corresponding coefficient. A cumulative adder is also provided for summing M successive outputs from the multiplier to provide a single, filtered output signal for each group of M input signals. The multiplier and adder are operated at a rate of M/N times a frequency of the input signal to thereby provide one output signal for every N input signals. In general, M and N are integers, M is greater than N, and N is at least two.

By implementing the filter with a single multiplier and a single cumulative adder, a separate multiplier and adder need not provided along with each delay element of each stage of the filter. Hence, a considerable savings in circuit area is achieved while also gaining the power savings of a polyphase filter.

In a specific exemplary implementation wherein N is 3, the delay elements are arranged as follows. The M delay elements are arranged in three groups with the delay elements of each group arranged as a shift register. A first delay element of a first group is connected directly to the input line. A first element of a second group is connected to the input line through a delay element operating to delay signals input thereto by the period of the input signal. A first element of a third group is connected to the input line through an additional delay element also operating to delay signals input thereto by the period of the input signal. Each of the M delay elements operates to delay signals input thereto by an amount three times a period of the input signal such that the M delay elements collectively generate M successively delayed versions of the input signal with the delayed versions being delayed with respect to each other by the period of the input signal. In a specific implementation wherein M is 14, the first and second group both have five delay elements. The third group has four. The frequency of the input signal is about 120 ks/sec. The delay elements of each group are therefore operated at 40 kHz.

In the specific exemplary implementation, a control unit is connected to the delay elements and the coefficient memory for controlling the delay elements and the coefficient memory to provide the multiplier with successively delayed outputs and corresponding coefficients at a rate of M/N times a frequency of the input signal.

Also, in the specific exemplary implementation, the cumulative adder is configured as follows. The cumulative adder includes an adder and a first latch register for storing outputs from the adder. A feedback path is provided for feeding back outputs from the register into the adder and a second latch register receives outputs from the first register. The first register is enabled by a clock signal operating at M/N times the frequency of the input signal and the second register is enabled by a clock signal operating at 1/N times the frequency of the input signal.

The invention is also implemented as a method.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

With reference to the remaining figures, preferred and exemplary embodiments of the invention will now be described. Initially, principles of the filter of the invention will be described with respect to a general N phase/M coefficient implementation illustrated in FIG. 6. Then a specific three-phase implementation will be described with reference to FIG. 7 wherein a filter employing fourteen coefficients is illustrated.

Figure 6:
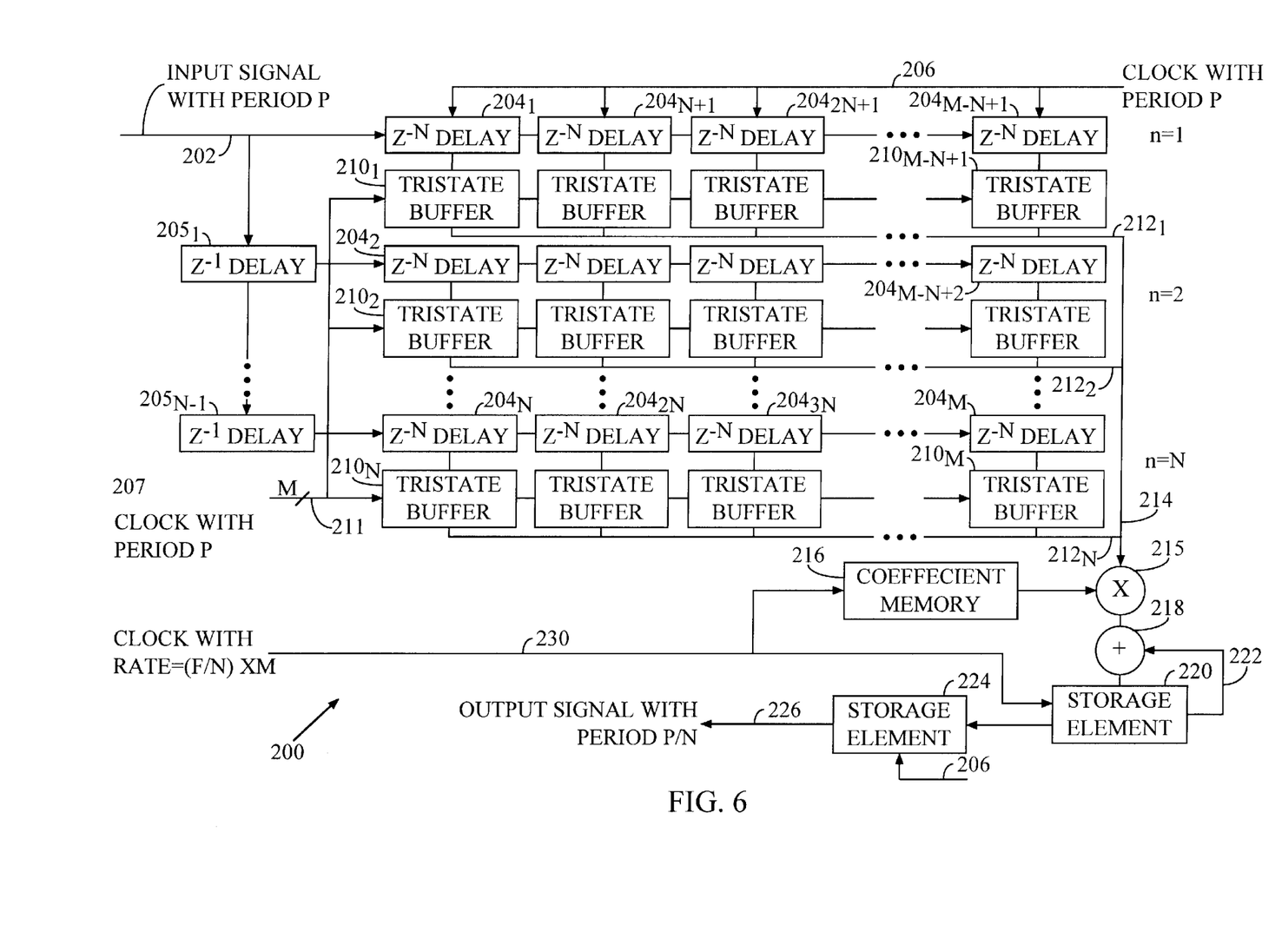
FIG. 6 is a block diagram illustrating an exemplary implementation of a polyphase digital filter configured in accordance with the invention.

FIG. 6 illustrates an N-phase, M-coefficient filter 200 having an input line 202 providing an input signal to a group of M $Z^{-N}$ delay elements generally denoted 204 and individually denoted $204_1$ to $204_M$. The input signal has a frequency of F samples per second and a period of P, i.e. the input signal provides one sample every P seconds. The delay elements 204 are arranged in N groups with each group having M/N delay elements. However, in general, the number of elements per group may differ from one group to another. For example, if M is not a multiple of N, then some of the groups may have more or fewer delay elements than the other groups. Each group of delay elements other than the first includes an additional $Z^{-1}$ delay element generally denoted 205 and individually denoted $205_1$–$205_{N-1}$. The additional $Z^{-1}$ delay elements are connected in series between the input line 202 and a first delay element of the respective group, i.e., additional delay elements $205_1$, $205_2$, ... $205_{N-1}$ are connected to delay elements $204_2$, $204_3$, ... $204_N$ respectively.

Delay elements 204 are each controlled by a clock signal having a period of P*N provided along line 206. Delay elements 205 are controlled by a clock signal having a period of P provided along line 207 to output whatever signal is currently input thereto on each cycle of the clock signal of line 207 as triggered by, for example, the rising edge of the clock signal.

Hence, additional delay elements 205 are triggered every P seconds. Delay elements 204 are triggered every P*N seconds. With this configuration, for an input stream comprising samples $x_1, x_2, x_3$ ... etc., the first group of delay elements outputs $x_1, x_2, x_{3N}$, etc., the second group of delay elements outputs $x_{N-1}, x_{2N-1}, x_{3N-1}$, etc., the nth group of delay elements outputs $x_{N-n-1}, x_{2N-n-1}, x_{3N-n-1}$, etc., and the last group (n=N) of delay elements outputs $x_1, x_{N+1}, x_{2N+1}$, etc. The signal of each delay element 204 is buffered with a tristate buffer element 210, to a common bus line. Tristate buffer elements 210 are controlled by individual enable signals having a frequency of F/N provided along line 211. The number of those tristate control signals equals M. Each one of them enables one tristate driver only, and only one active at any particular time. Samples are output one at a time on the common data bus that includes lines 214, $212_1, 212_2, \ldots 212_N$. In essence M multiply accumulates are performed in T=N/F seconds. The rate of multiply accumulates is R=M×(F/N) per second.

Samples are therefore provided along line 214 at a rate of M*F/N per second. Once the samples have propagated through all of delay elements 204, line 214 thereby provides M samples during every N cycles of the input signal provided along line 202.

Each group of M samples are routed into a multiplier 215 which also receives M respective filter coefficient $h_0$–$h_{M-1}$ from a coefficient memory 216. Coefficient memory 216 is controlled by a clock signal of line 230 to provide M output coefficients every N cycles of the input clock signal. Multiplier 215 thereby multiplies each sample x received along line 214 with the corresponding coefficient h. The results are summed by a cumulative adder composed of an adder 218 and a storage element 220. Storage element 220 is also controlled by the clock signal of line 230 to output a current cumulative total along a feedback line 222 to adder 218 for adding to a next output of multiplier 215. The cumulative result is presented to a second storage element 224 which is controlled by the clock signal of line 206 to output the cumulative sum at the end of each group of N cycles of the input clock signal. In this manner, multiplier 215, adder 218 and storage elements 220 and 224 together perform the following operation:

$$y = \sum_{m=1}^{M} x_m h_{M-m} \qquad \text{Eq. 6}$$

during each N cycles of the input signal. Signal y is ultimately output along line 226.

Hence, during a first group of three clock cycles of the input signal (following the point where the input signal has propagated to all of the delay elements 204), the cumulative adder sums and outputs:

$$y_1 = x_1 h_{M-1} + x_2 h_{M-2} + \ldots + x_{M-1} h_1 + x_M h_0$$

During a second group of three clock cycles of the input signal, the cumulative adder sums:

$$y_2 = x_4 h_{M-1} + x_5 h_{M-2} + \ldots + x_{M+2} h_1 + x_{M+3} h_0$$

During a third group three clock cycles of the input signal, the cumulative adder sums:

$$y_2 = x_7 h_{M-1} + x_8 h_{M-2} + \ldots + x_{M+5} h_1 + x_{M+6} h_0$$

And so forth.

Before input signals have propagated to all of the delay elements 204, i.e. before signal $x_1$ has propagated to delay element $204_M$, zeros are output from the delay elements that have not yet received an input value. Hence, the multiplier multiplies values of zero against some of the coefficients. For example, $$y_{-1} = 0 * h_{M-1} + x_1 h_{M-2} + \ldots + x_{M-2} h_1 + x_{M-1} h_0$$

In this manner, the summed output signal y is formed from fewer input signals. Such may also be required at the end of an input string.

Also, it should be noted that the order with which coefficients are applied to the input signal of the embodiment of FIG. 6 differs slightly from the embodiment of FIG. 5. In FIG. 5, for example, $h_0$ is multiplied against $x_2, x_5, x_8$ etc. whereas in the implementation of FIG. 6, $h_0$ is multiplied against $x_1, x_4, x_7$ etc. This difference is not significant. Indeed, for each group of three input samples x, it is essentially arbitrary whether the first, second or third of those three samples is multiplied against $h_0$, and whether the first, second or third is multiplied against $h_1$ etc. Moreover, the controller may be configured to control the coefficient memory to output the coefficients in any desired order such that $h_0$ can, for example, be applied against $x_2, x_5, x_8$ etc. rather $x_1, x_4, x_7$ etc.

In the following, a specific implementation is described wherein N is 3, M is 14.

Figure 7:
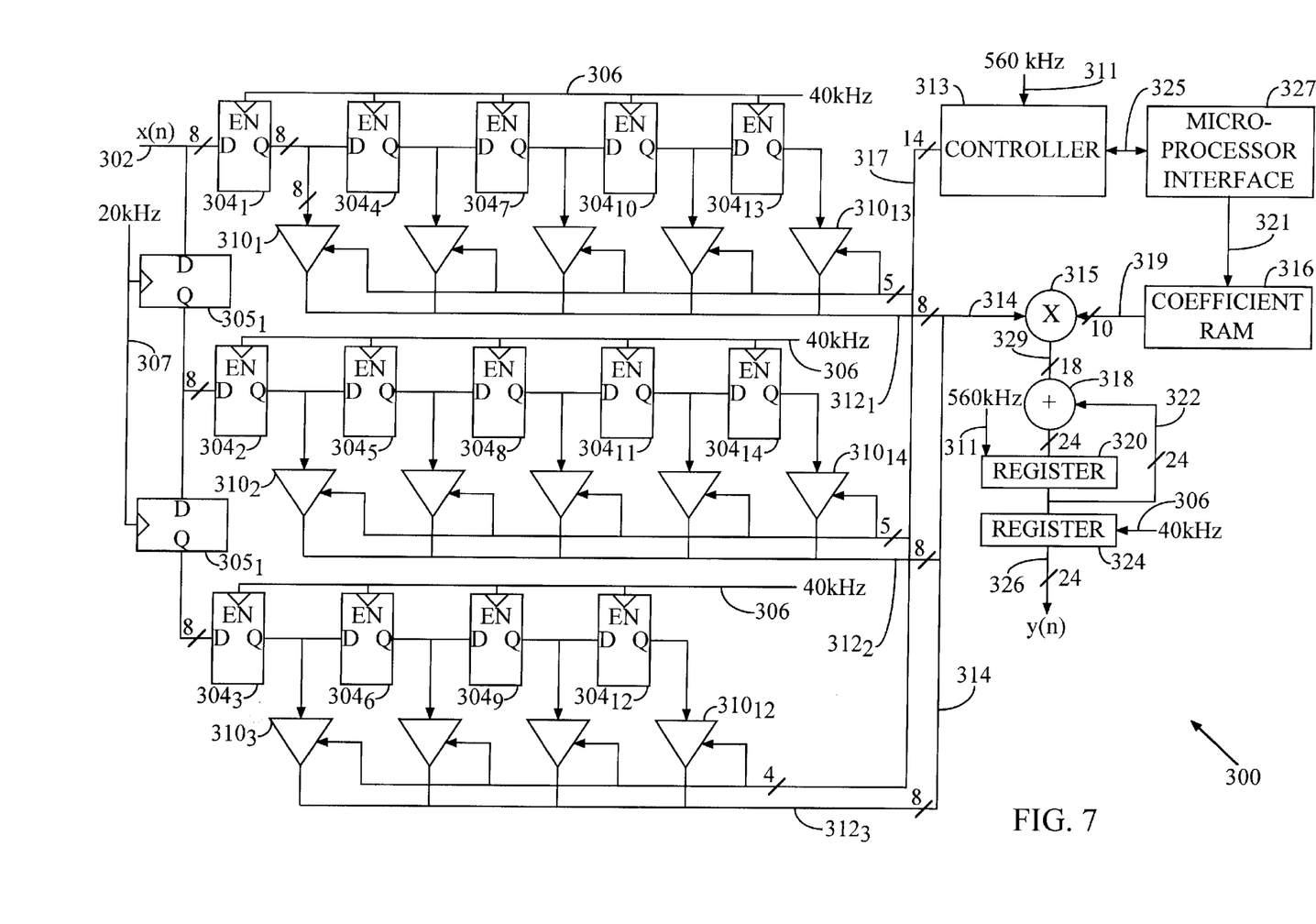
FIG. 7 is a schematic representation of a three-phase implementation of the digital filter of FIG. 6.

FIG. 7 illustrates a three-phase filter 300 similar to the N-phase filter of FIG. 6. Like components are identified by like reference numerals incremented by 100. Only pertinent differences will be described in detail. Filter 300 has an input line 302 providing an input signal to a group of fourteen latches generally denoted 304 and individually denoted $304_1$ to $304_{14}$. The input signal has a frequency of 120 ks/sec and a period of $8.33 * 10^{-6}$ seconds. Each sample is composed of eight bits. Latches 304 are arranged in three groups with first and second groups having five latches and a third group having four latches. Each latch 304 is an edge-triggered type-D latch triggered by a 40 kHz clock signal provided along a clock line 306. Each latch 304 outputs whatever signal is currently applied to its input on every rising edge of the 40 kHz and it is an array of latches constituting a register of width 8 bits. The second and third groups of latches both include an additional latch $305_1$ and $305_2$ respectively. Additional latch $305_1$ is connected between the input line 302 and latch $304_1$. Additional latch $305_2$ is connected between an output of latch $305_1$ and an input of latch $304_1$. Each additional latch 305 is an edge-triggered type-D latch triggered by a 120 kHz clock signal provided along a clock line 307. Each latch 305 outputs whatever signal is currently applied to its input on every rising edge of the 120 kHz.

With this configuration, for an input stream comprising samples $x_1, x_2, x_3 \ldots$ etc., the first group of five latches outputs $x_3, x_6, x_9$, etc., the second group of five latches outputs $x_2, x_5, x_8$, etc., the third group of four latches outputs $x_1, x_4, x_7$, etc. The signal output from each latch $304_1-304_{14}$ upon the rising edge of the 120 kHz clock of line 306 are output to a respective tristate buffer $310_1-310_{14}$. Tristate buffers $310_1-310_{14}$ are enabled by respective bits lines of a fourteen-bit control signal provided along line 317 from a controller 313 to output whatever signal is currently stored therein upon each cycle of a 560 kHz clock signal. The 560 kHz clock signal is provided to the controller 313 on a clock line 311. Controller 313 triggers each of the tri-state buffers $310_1-310_{14}$ in order by sequentially pulling up the voltage on each of the individual lines of fourteen-bit control signal line 317, with one tristate buffer enabled on each rising edge of the 560 kHz clock signal and remain enabled for a time equal to the period of the 560 Khz clock. In this manner, controller 313 cycles through the outputs of each of the fourteen tristate buffers 310 during every three cycles of the input 120 kHz clock signal. Signals are output from tristate buffers 310 of each of the three groups along a respective 8-bit output line $312_1-312_3$ which feed into a common 8-bit output line 314. Once the samples have propagated through all of latches 304, line 314 thereby provides fourteen samples $x_1, x_2, \ldots, x_{14}$ during every three cycles of the 120 kHz input signal provided along line 302.

The 8-bit samples provided on line 314 are synchronized to the clock signal of line 311. Each group of fourteen samples are routed into a multiplier 315 which also receives one of fourteen respective filter coefficients $h_0-h_{M-1}$ along a 10-bit line 319 from a 14×10 coefficient RAM 316. Coefficient RAM 316 is controlled by signals received from a microprocessor interface 327 by appropriate D, WR, ADD, RD, CLK and CS signals (not individually shown) provided upon control lines 321. Microprocessor interface 327 provides an interface to controller 313 via lines 325 and provides an interface, via control lines not separately shown, to other components of a device incorporating filter 300 such as to other components of a cellular telephone as illustrated in FIG. 1. Controller 313 receives the 560 kHz clock signal along line 311 and outputs it along with appropriate RD and ADD signals (also not individually shown) along lines 325 to microprocessor interface 327. Hence, the CLK signal employed to control coefficient RAM 316 is the 560 kHz clock signal of line 311.

The microprocessor interface controls the coefficient RAM to output the fourteen coefficients in succession which one coefficient output per cycle of the 560 kHz clock signal to thereby provide fourteen output coefficients every three cycles of the input 120 kHz clock signal. Multiplier 315 multiplies each sample x received along line 314 with the corresponding coefficient h received from the coefficient RAM and output along an 18-bit line 329. The results provided along line 329 are summed by a cumulative adder composed of a combinatorial adder 318 and a latch or other register 320 connected by a 24-bit line. Register 320 is also controlled by the 560 kHz clock signal of line 311 to output a current cumulative total along a 24-bit feedback line 322 to adder 318 for adding to a next output of multiplier 315. The cumulative result is presented to a second register 324 which is controlled by the 40 kHz clock signal of line 306 to thereby output the cumulative result at the end of each group of three cycles of the input 120 kHz clock signal. In this manner, multiplier 315, adder 318 and registers 320 and 324 together perform the following operation:

$$y = \sum_{m=1}^{14} x_m h_{14-m} \qquad \text{Eq. 7}$$

during each three cycles of the 120 kHz input signal thereby providing a single output y for every three inputs x. Signal y is ultimately output along line 326.

Hence, following the point where the input signal has propagated to all of the latches 304, the cumulative adder sums and outputs:

$y_1 = x_1h_{13} + x_2h_{12} + x_3h_{11} + x_4h_{10} + x_5h_9 + x_6h_8 + x_7h_7 + x_8h_6 + x_9h_5 + x_{10}h_4 + x_{11}h_3 + x_{12}h_2 + x_{13}h_1 + x_{14}h_0$

During a second group of three clock cycles of the input signal, the cumulative adder sums:

$y_2 = x_4h_{13} + x_5h_{12} + x_6h_{11} + x_7h_{10} + x_8h_9 + x_9h_8 + x_{10}h_7 + x_{11}h_6 + x_{12}h_5 + x_{13}h_4 + x_{14}h_3 + x_{15}h_2 + x_{16}h_1 + x_{17}h_0$

And so forth.

The output signal $y_n$ is thereafter routed to, for example, a demodulator of a cellular telephone as shown in FIG. 1 above.

The preceding description of the preferred and exemplary embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein. Also, it should be appreciated that not all components necessary for a complete implementation of a practical system are illustrated or described in detail. Rather, only those components necessary for a thorough understanding of the invention have been illustrated and described.

I claim:

1. A discrete N-phase digital filter comprising:
    an input line providing an input signal;
        a group of M delay elements connected to said input line for generating M successively delayed versions of the input signal;
        a coefficient memory unit for storing M filter coefficients;

a multiplier connected to outputs of said delay elements and to said coefficient memory for multiplying the output of each successive delay element with a corresponding coefficient; and a cumulative adder for summing M successive outputs from said multiplier to provide a single, filtered output signal for each group of M input signals, said multiplier and adder being operated at a rate of M/N times a frequency of the input signal to thereby provide one output signal for every N input signals; wherein said M delay elements are arranged in N groups with the delay elements of each group arranged as a shift register;

with a first delay element of a first group being connected directly to the input line;

with a first element of a second group being connected to said input line through a first additional delay element operating to delay signals input thereto by the period of the input signal;

with a first element of a third group being connected to an output of said first additional delay element through a second additional delay element also operating to delay signals input thereto by the period of the input signal;

each of said M delay elements operates to delay signals input thereto by an amount three times a period of the input signal such that the M delay elements collectively generate M successively delayed versions of the input signal with the delayed versions being delayed with respect to each other by a multiple of the period of the input signal; and wherein M and N are integers, M is greater than N, and N is 3.

2. The filter of claim 1 wherein M is 14 and said first and second groups of delay elements each have five delay elements and said third group has four delay elements.

3. The filter of claim 1 wherein each of the M delay elements are latches enabled by a clock operating at a frequency of 1/N times the frequency of the input signal.

4. A discrete N-phase digital filter comprising:

an input line providing an input signal;

a group of M delay elements connected to said input line for generating M successively delayed versions of the input signal;

a coefficient memory unit for storing M filter coefficients;

a multiplier connected to outputs of said delay elements and to said coefficient memory for multiplying the output of each successive delay element with a corresponding coefficient; and a cumulative adder for summing M successive outputs from said multiplier to provide a single, filtered output signal for each group of M input signals, said multiplier and adder being operated at a rate of M/N times a frequency of the input signal to thereby provide one output signal for every N input signals; wherein M and N are intergers, M is greater than N, and N is at least two;

said M delay elements are arranged in N groups with the delay elements of each group arranged as a shift register;

with a first delay element of an nth group being connected to said input line through n−1 delay elements each operating to delay signals input thereto by the period of the input signal; and wherein each of said M delay elements operates to delay signals input thereto by an amount N times a period of the input signal such that the M delay elements collectively generate M successively delayed versions of the input signal with the delayed versions being delayed with respect to each other by a multiple of the period of the input signal.

5. The filter of claim 4 wherein said cumulative adder comprises an adder;

a first latch register for storing outputs from said adder;

a feedback path for feeding back outputs from said register into said adder; and a second latch register for receiving outputs from said first register; with said first register enabled by a clock signal operating at M/N times the frequency of the input signal and said second register enabled by a clock signal operating at 1/N times the frequency of the input signal.

6. A discrete N-phase digital filter comprising:

an input line providing an input signal;

a group of M delay elements connected to said input line for generating M successively delayed versions of the input signal;

wherein said M delay elements are arranged in N groups with the delay elements of each group arranged as a shift register;

with a first delay element of an nth group being connected to said input line through n−1 delay elements each operating to delay signals input thereto by the period of the input signal;

a coefficient memory unit for storing M filter coefficients;

a multiplier connected to outputs of said delay elements and to said coefficient memory for multiplying the output of each successive delay element with a corresponding coefficient;

a control unit connected to said delay elements and said coefficient memory for controlling said delay elements and said coefficient memory to provide said multiplier with successively delayed outputs and corresponding coefficients at a rate of M/N times a frequency of the input signal; and a cumulative adder for summing outputs from said multiplier, said cumulative adder being controlled to sum every M outputs to yield a single filtered output signal for every N input signals;

wherein M and N are integers, M is greater than N, and N is at least two.

7. A method for performing discrete N-phase digital filtering comprising the steps of:

receiving an input signal;

arranging a group of M delay elements into N groups with the delay elements of each group arranged as a shift register, wherein a first delay element of an nth group is connected to an input line through n−1 delay elements each operating to delay signals input thereto by the period of the input signal;

generating M successively delayed versions of the input signal by routing the input signal through the group of M delay elements;

multiplying the output of each successive delay element with a corresponding coefficient using a single multiplier unit; and summing M successive outputs from said multiplier using a single adder unit to provide a single, filtered output signal for each group of M input signals;

wherein M and N are integers, M is greater than N, and N is at least two.

* * * * *